(12) United States Patent
McLellan et al.

(10) Patent No.: US 6,498,099 B1
(45) Date of Patent: Dec. 24, 2002

(54) LEADLESS PLASTIC CHIP CARRIER WITH ETCH BACK PAD SINGULATION

(75) Inventors: Neil McLellan, Branksom (HK); Nelson Fan, Sham Tseng (HK)

(73) Assignee: ASAT Ltd., Tsuen Wan (HK)

( * ) Notice: Subject to any disclaimer, the term of this patent is extended or adjusted under 35 U.S.C. 154(b) by 0 days.

(21) Appl. No.: 09/288,352

(22) Filed: Apr. 8, 1999

Related U.S. Application Data

(63) Continuation-in-part of application No. 09/095,803, filed on Jun. 10, 1998, now Pat. No. 6,229,200.

(51) Int. Cl.[7] .............................. H01L 21/302
(52) U.S. Cl. ................. 438/689; 438/706; 438/710; 438/720; 438/745; 438/754
(58) Field of Search .................. 438/690, 689, 438/706, 710, 745, 720, 754

(56) References Cited

U.S. PATENT DOCUMENTS

| | | | |
|---|---|---|---|
| 4,530,152 A | * 7/1985 | Roche et al. ................. 29/588 |
| 5,457,340 A | * 10/1995 | Templeton, Jr. et al. .... 257/666 |
| 5,710,695 A | * 1/1998 | Manteghi ..................... 361/813 |
| 5,976,912 A | * 11/1999 | Fukutomi et al. ........... 438/110 |
| 6,001,671 A | * 12/1999 | Fjelstad ....................... 438/112 |
| 6,229,200 B1 | * 5/2001 | Mclellan et al. ............ 257/666 |

FOREIGN PATENT DOCUMENTS

JP 59-208756 * 11/1984

* cited by examiner

Primary Examiner—Robert Kunemund
Assistant Examiner—Charlotte A. Brown
(74) Attorney, Agent, or Firm—Keating & Bennett, LLP

(57) ABSTRACT

A leadless plastic chip carrier is constructed by half etching one or both sides of the package design onto a leadframe strip. After wire bonding and molding, a further etching is performed to isolate and expose contact pads. Singulation of individual chip packages from the leadframe strip may then be performed by saw singulation or die punching.

12 Claims, 10 Drawing Sheets

Step 6: Final etching

Step 6.1: Stripping

Step 7: Electroless gold plating

Step 8: Singulation ( sawing or punching )

Step 1: Raw material (Copper Panel)

Step 2: Both side partial etch

Step 3: Full Ni / Pd plating

Step 4: Assembly ( D / A, W / B and Molding )

Step 5: Photo-resist (wet film) printing and curing (development)

Step 6: Final etching

Step 6.1: Stripping

Step 7: Electroless gold plating

Step 8: Singulation ( sawing or punching )

Step 1: Raw material (Copper Panel)

Step 2: Both side partial etch (Mirror image)

Step 3: Full Ni / Pd or Ag plating

Step 4: Assembly ( D / A, W / B and Molding )

Step 5: Final etching

Step 6: Electroless gold plating

Step 7: Singulation ( sawing or punching )

Step 1: Raw material (Copper Panel)

Step 2: Top side partial etch

Step 3: Full Ni / or Ag plating

Step 4: Assembly ( D / A, W / B and Molding )

Step 5: Final etching

Step 6: Electroless gold plating

Step 7: Solder ball attachment (optional)

Step 8: Singulation ( sawing or punching )

Step 1: Raw material (Copper Panel)

Step 2: Top side partial etch

Step 3: Full Ni / or Ag plating

Step 4: Assembly ( D / A, W / B and Molding )

Step 5: Photo-resist application, exposure, and developing

Note : Dry film laminating or Wet-film spin coating

Step 6: Final etching

Step 7: Photo - resist stripping

Step 8: Electroless gold plating

Step 8: Singulation ( sawing or punching )

Step 1: Raw material (Copper Panel)

Step 2: Photo resist lamination and development

Step 3: Cu/Ni/Au electrolytic plat up for "1st level connect"

Step 4: Stripping

Step 5: -ve photo-resist lamination and development

Step 6: Pre-etch for 2nd level connect

Step 7: Stripping and clearing

Step 8: Assembly (D/A, W/B and Mold)

Step 9: Assembly (Post etching)

Step 10: Singulation

LEADLESS PLASTIC CHIP CARRIER WITH ETCH BACK PAD SINGULATION

CROSS-REFERENCE TO RELATED APPLICATION

This is a continuation-in-part of U.S. patent application Ser. No. 09/095,803, filed Jun. 10, 1998 issued as U.S. Pat. No. 6,229,200.

FIELD OF THE INVENTION

The present invention relates in general to integrated circuit packaging, and more particularly to an improved process for fabricating a leadless plastic chip carrier which includes a post mold etch back step.

BACKGROUND OF THE INVENTION

According to well known prior art IC (integrated circuit) packaging methodologies, semiconductor dice are singulated and mounted using epoxy or other conventional means onto respective die pads (attach paddles) of a leadframe strip. Traditional QFP (Quad Flat Pack) packages incorporate inner leads which function as lands for wire bonding the semiconductor die bond pads. These inner leads typically require mold locking features to ensure proper positioning of the leadframe strip during subsequent molding to encapsulate the package. The inner leads terminate in outer leads that are bent down to contact a mother board, thereby limiting the packaging density of such prior art devices.

In order to overcome these and other disadvantages of the prior art, the Applicants previously developed a Leadless Plastic Chip Carrier (LPCC). According to Applicants' LPCC methodology, a leadframe strip is provided for supporting up to several hundred devices. Singulated IC dice are placed on the strip die attach pads using conventional die mount and epoxy techniques. After curing of the epoxy, the dice are gold wire bonded to peripheral internal leads. The leadframe strip is then molded in plastic or resin using a modified mold wherein the bottom cavity is a flat plate. In the resulting molded package, the die pad and leadframe inner leads are exposed. By exposing the bottom of the die attach pad, mold delamination at the bottom of the die paddle is eliminated, thereby increasing the moisture sensitivity performance. Also, thermal performance of the IC package is improved by providing a direct thermal path from the exposed die attach pad to the motherboard. By exposing the leadframe inner leads, the requirement for mold locking features is eliminated and no external lead standoff is necessary, thereby increasing device density and reducing package thickness over prior art methodologies. The exposed inner leadframe leads function as solder pads for motherboard assembly such that less gold wire bonding is required as compared to prior art methodologies, thereby improving electrical performance in terms of board level parasitics and enhancing package design flexibility over prior art packages (i.e. custom trim tools and form tools are not required). These and several other advantages of Applicant' own prior art LPCC process are discussed in Applicants' co-pending patent application Ser. No. 09/095,803, the contents of which are incorporated herein by reference.

Applicants' LPCC production methodology utilizes saw singulation to isolate the perimeter I/O row as well as multi-row partial lead isolation. Specifically, the leadframe strip is mounted to a wafer saw ring using adhesive tape and saw-singulated using a conventional wafer saw. The singulation is guided by a pattern formed by fiducial marks on the bottom side of the leadframe strip. Also, special mold processing techniques are used to prevent the mold flow from bleeding onto the functional pad area and inhibiting electrical contact. Specifically, the exposed die pad surface is required to be deflashed after molding to remove any molding compound residue and thereby allow the exposed leads and die attach pad to serve as solder pads for attachment to the motherboard.

SUMMARY OF THE INVENTION

According to the present invention, an etch back process is provided for the improved manufacture of Applicants' LPCC IC package. The leadframe strip is first subjected to a partial etch on one or both of the top and bottom surfaces in order to create a pattern of contact leads (pads) and a die attach pad (paddle). After wire bonding the contacts to a singulated semiconductor die, followed by overmolding and curing of the mold, the leadframe strip is exposed to a second full etch immersion for exposing the contact pads in an array pattern (i.e. multi-row) or perimeter pattern (i.e. single row), as well as the die attach pad. In the case of a package with multi-row I/O leads, this etch back step eliminates the requirement for two additional saw singulation operations (i.e. to sever the inner leads from the outer leads), and in both the single-row and multi-row configurations, the etch back step eliminates post mold processing steps (e.g. mold deflashing) and ensures superior device yield over the processing technique set forth in Applicants' prior application Ser. No. 09/095,803. Additionally, using this technique allows for higher I/O pad density and also allows for pad standoff from the package bottom which reduces stress in the solder joint during PCB temp cycling.

BRIEF DESCRIPTION OF THE DRAWINGS

A detailed description of the invention is provided herein below with reference to the following drawings, in which.

DETAILED DESCRIPTION OF THE PREFERRED EMBODIMENT

Figure 1A:
FIGS. 1A–1I show processing steps for manufacturing a Leadless Plastic Chip Carrier (LPCC) with top and bottom partial etch resulting in a bottom etch cavity, according to a first embodiment of the invention.

The Leadless Plastic Chip Carrier with Etch Back Singulation (LPCCEBS) according to the present invention is an improvement over Applicants' LPCC process as set forth in co-pending application Ser. No. 09/095,803. Where possible, the same reference numerals have been used in this application to denote identical features described in Applicants' earlier application. Reference may be had to Applicants' co-pending application for additional details concerning processing steps which are common to both inventions.

FIGS. 1A–1I show steps in the manufacture of an LPC-CEBS according to a first embodiment of the invention—namely, with top and bottom side partial etch and bottom etch cavity.

With reference to FIG. 1A, an elevation view is provided of a copper panel substrate which forms the raw material of the leadframe strip 100. As discussed in greater detail in Applicants' co-pending application Ser. No. 09/095,803, the leadframne strip 100 is divided into a plurality of sections, each of which incorporates a plurality of leadframe units in an array (e.g. 3×3 array, 5×5 array, etc.). Only one such unit is depicted in the elevation view of FIG. 1A, portions of adjacent units being shown by stippled lines.

The leadframe strip 100 is subjected to a partial etch on both top and bottom sides (FIG. 1B) to pattern the contact pads 203 and die attach pad 202. Next, the strip 100 is plated with silver (Ag) or nickel/palladium (Ni/Pd) to facilitate wire bonding (FIG. 1C).

A singulated semiconductor die 206 is conventionally mounted via epoxy (or other means) to the die attach pad 202, and the epoxy is cured. Gold wires 205 are then bonded between the semiconductor die 206 and peripheral leads or contacts 203. The leadframe 100 is then molded using a modified mold with the bottom cavity being a flat plate, and subsequently cured, as discussed in Applicants' application Ser. No. 09/095,803. The leadframe 100 after the foregoing steps is as shown in FIG. 1D, which includes overmold 401 of cured plastic or epoxy.

Next, rather than post-mold deflashing, as performed according to Applicants' prior methodology, a wet film layer of photoresist 402 is printed onto the bottom of leadframe 100 so as to cover portions of the bottom surface which are to be protected from etchant (i.e. positive photoresist). The photoresist is then developed (cured) using conventional means (FIG. 1E).

The leadframe 100 is then subjected to a final etching via full immersion (FIG. 1F) which exposes an array or perimeter pattern of exposed contact pads 203 and the die attach pad 206.

The photoresist layer 402 is then stripped using conventional means (FIG. 1G), resulting in small protrusions below the molded body for contact pads 203. After this etch back step, the leadframe strip 100 is coated with either electroless gold or solder dip to facilitate pad soldering (FIG. 1H). Alternatively, barrel plated solder or chemically passivated bare copper may be used for terminal finishing.

At this stage of manufacture, the pads 203 and 202 are fully isolated and exposed. Singulation of the individual units from the full leadframne array strip 100 may then be performed either by saw singulation or die punching (FIG. 1I).

Figure 1B:
Figure 1C:
Figure 1D:
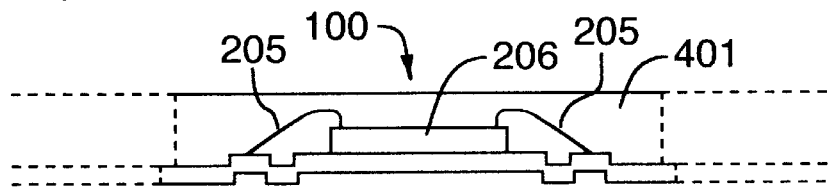
Figure 1E:
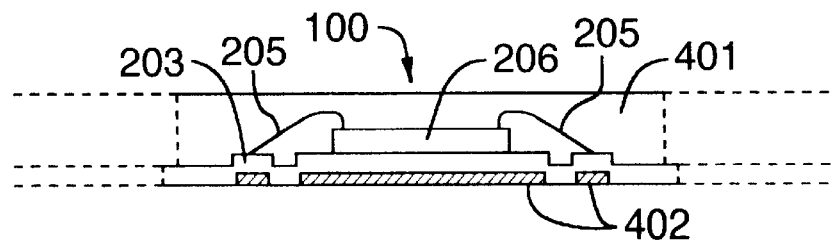
Figure 1F:
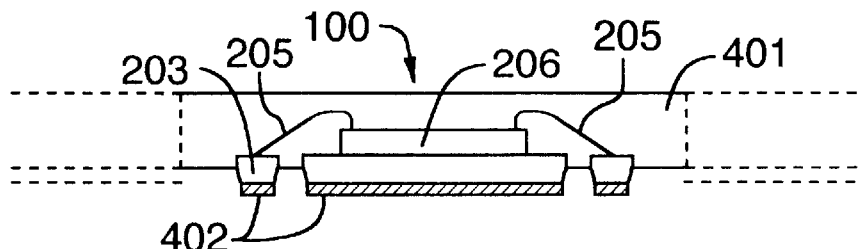
Figure 1G:
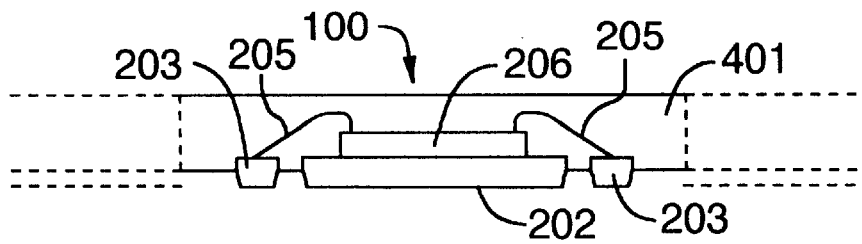
Figure 1H:
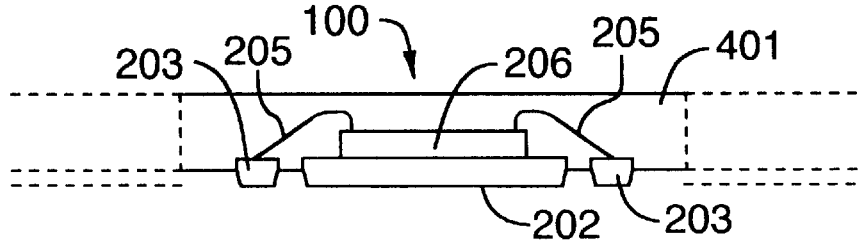
Figure 1I:
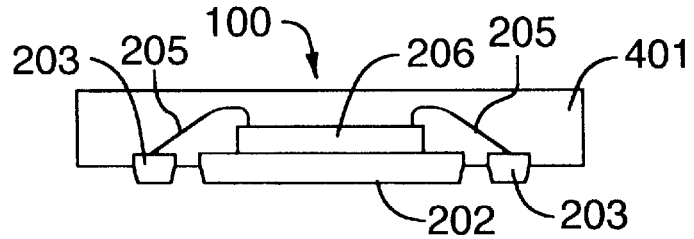
Figure 2A:
FIGS. 2A–2G show processing steps for manufacturing a Leadless Plastic Chip Carrier (LPCC) with top and bottom partial etch incorporating standoff, according to a second embodiment of the invention.
Figure 2B:
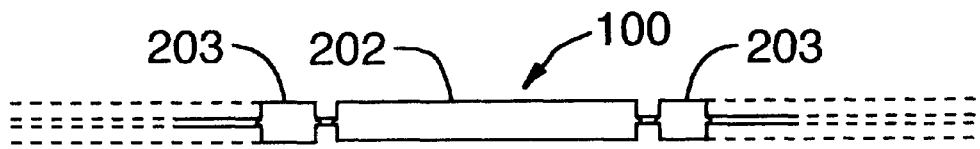
Figure 2C:
Figure 2D:
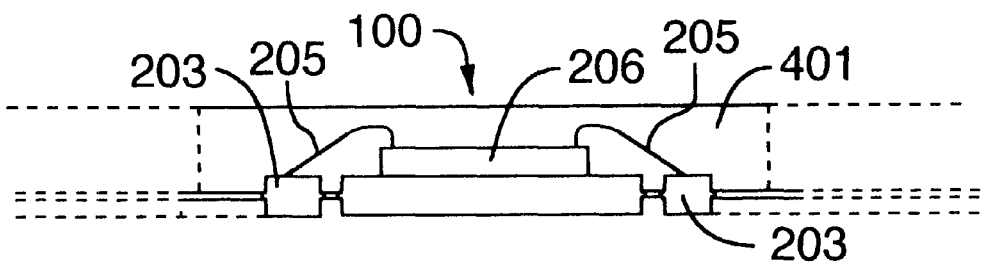
Figure 2E:
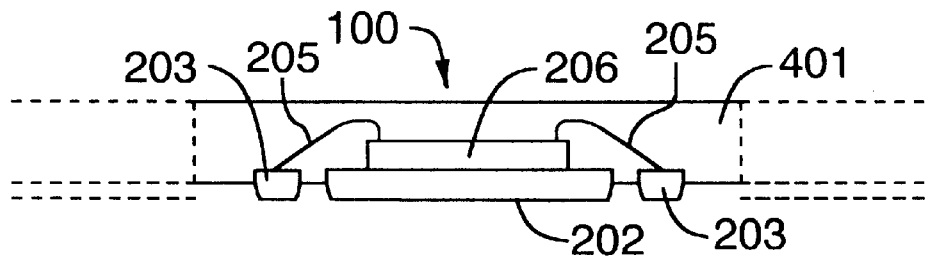
Figure 2F:
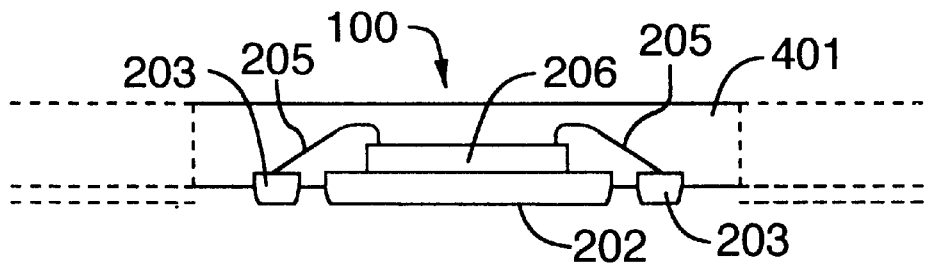
Figure 2G:
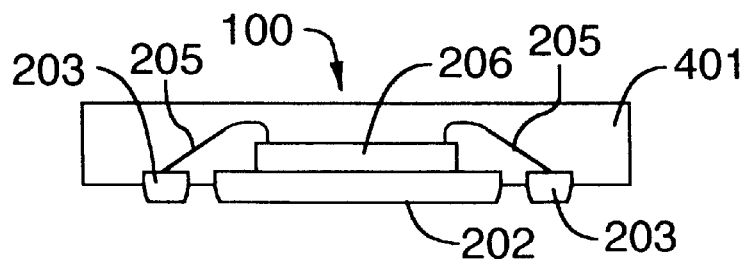
Figure 3A:
FIGS. 3A–3H show processing steps for manufacturing a Leadless Plastic Chip Carrier (LPCC) with top side partial etch and solder ball attachment, according to a third embodiment of the invention.
Figure 3B:
Figure 3C:
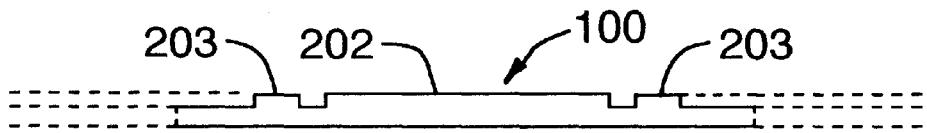
Figure 3D:
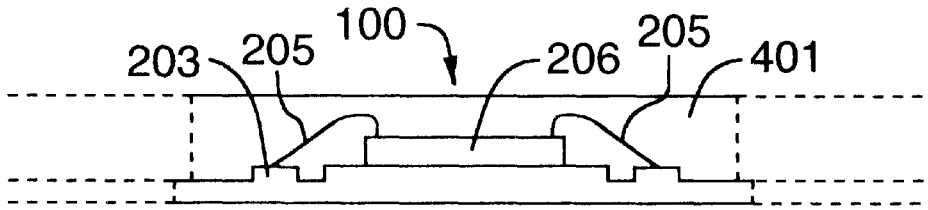
Figure 3E:
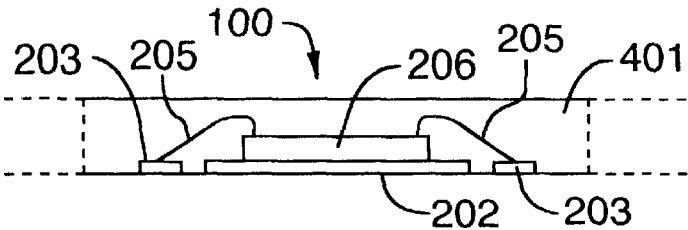
Figure 3F:
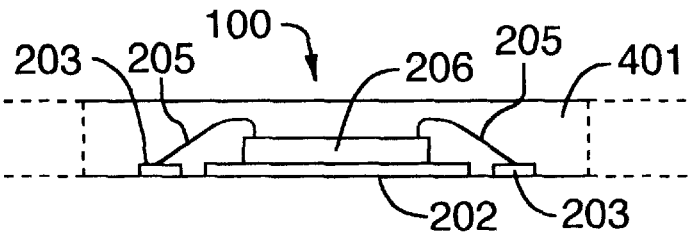
Figure 3G:
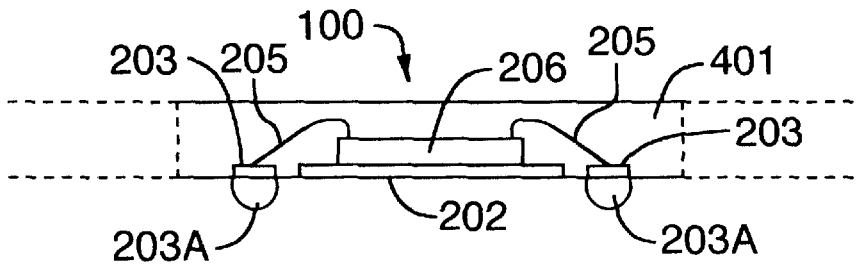
Figure 3H:
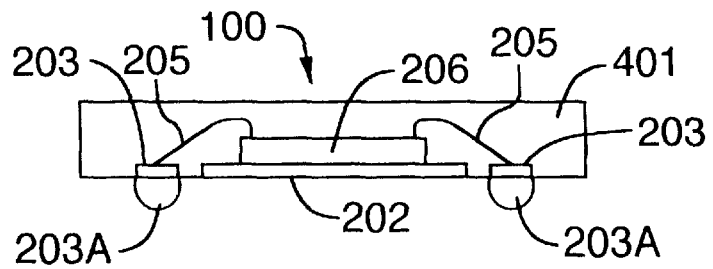
Figure 4A:
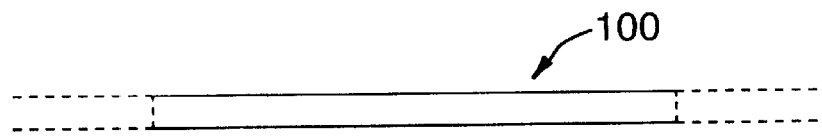
FIGS. 4A–4I show processing steps for manufacturing a Leadless Plastic Chip Carrier (LPCC) with top side partial etch incorporating standoff, according to a fourth embodiment of the invention.
Figure 4B:
Figure 4C:
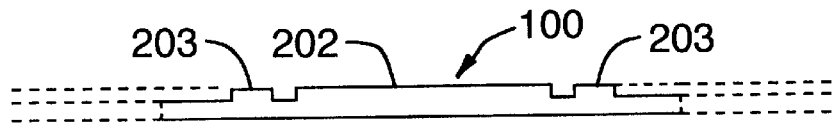
Figure 4D:
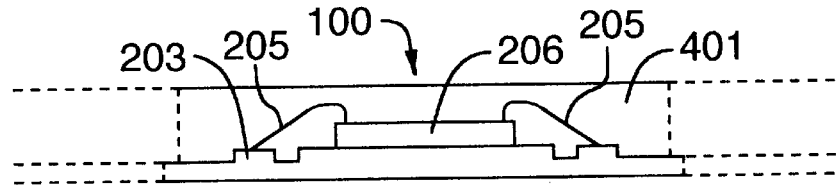
Figure 4E:
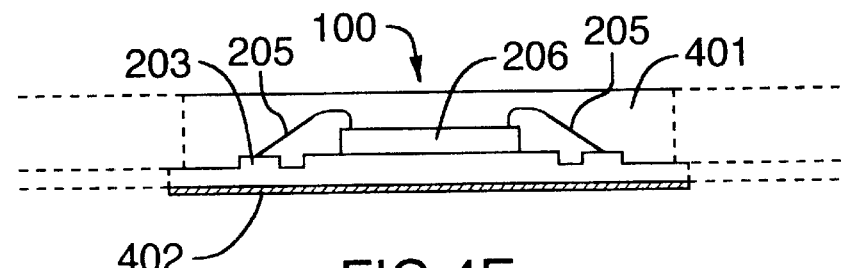
Figure 4F:
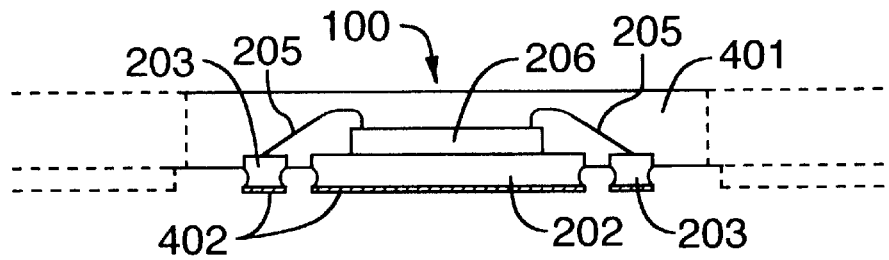
Figure 4G:
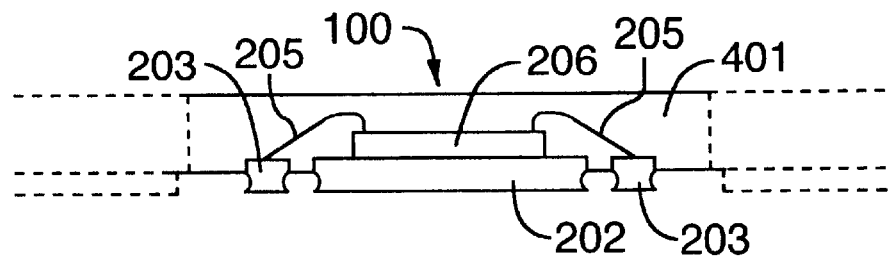
Figure 4H:
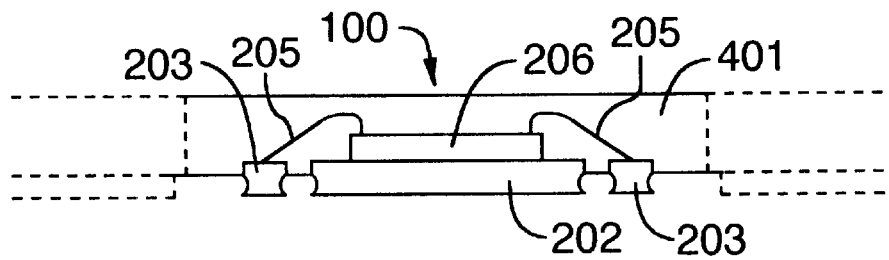
Figure 4I:
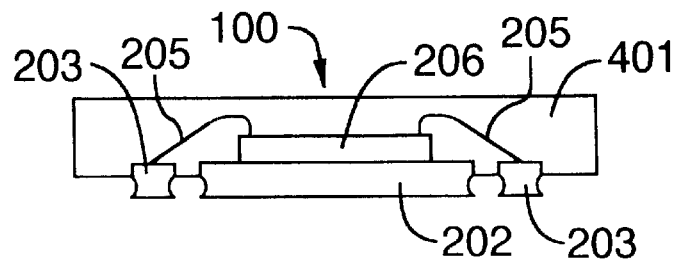

The embodiment of FIGS. 2A–2G is similar to that of FIGS. 1A–1I, except that the partial etch (FIG. 2B) is a "mirror image" partial etch which results in a "standoff" structure, rather than being an offset pattern as shown in FIG. 1B. Consequently, no photoresist application is required following the mold step (FIG. 2D) and prior to the final etch back step (FIG. 2E).

The LPCC fabrication process of the present invention may alternatively utilize a single side first partial etch, as shown in FIGS. 3 and 4. FIGS. 3A–3H show a single side partial etch process wherein, after the final full immersion etch and electroless gold plating (FIGS. 3E and 3F), the pads 203 are above the mold line so that solder balls 203A are required to be attached in order to allow board mounting. FIGS. 4A–4I show a single side first partial etch with standoff (similar in this respect to the process of FIG. 2). A layer of photoresist 402 is applied (FIG. 4E) and patterned, prior to the final etch back step (FIG. 4F). In other respects, the steps depicted in FIGS. 3 and 4 are similar to the steps discussed above and illustrated in FIGS. 1 and 2, respectively.

Figure 5A:
FIGS. 5A–5J show processing steps for manufacturing a Leadless Plastic Chip Carrier (LPCC) with bottom side partial etch, according to a fifth embodiment of the invention.
Figure 5B:
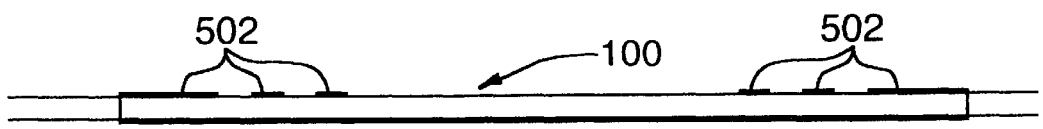
Figure 5C:
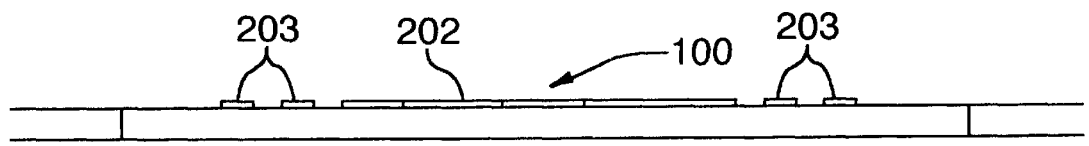
Figure 5D:
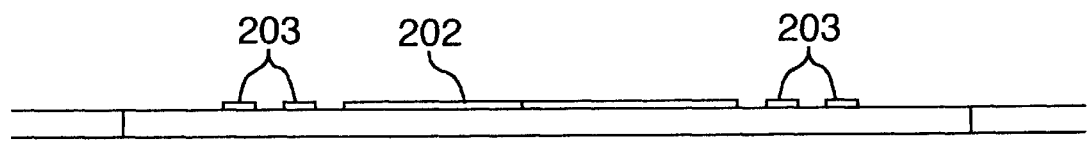

FIGS. 5A–5J show steps according to the etch back process of the present invention, for fabricating an LPCC with multi-row partial lead isolation. In FIG. 5A, a copper panel is provided, to which photoresist 502 is applied and patterned for a "first level" connect (FIG. 5B). An electrolytic plat of Cu/Ni/Au is applied to portions of the leadframe strip not covered by photoresist (FIG. 5C). The photoresist is then stripped (FIG. 5D), resulting in the structure of FIG. 5D with contact pads 203 and attach pad 202.

Figure 5E:
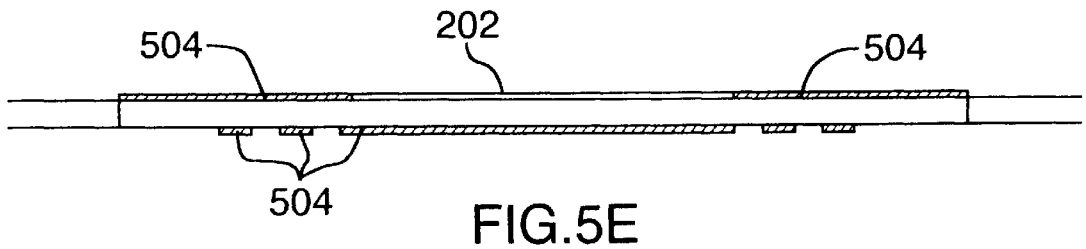
Figure 5F:
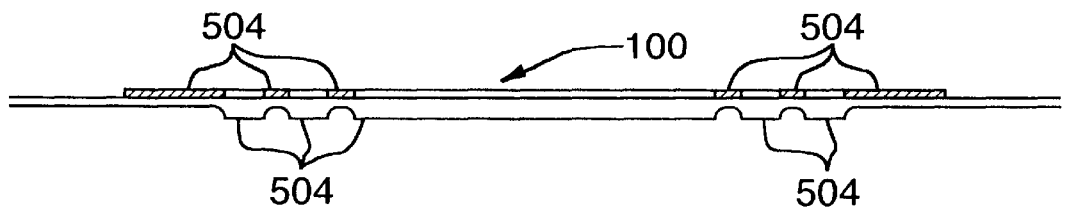
Figure 5G:
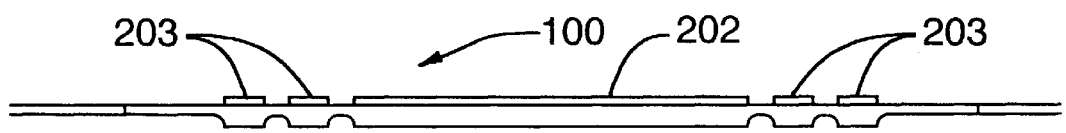

A layer of negative photoresist 504 is applied and patterned for a "second level" connect (FIG. 5E). A pre-etch step is then performed (FIG. 5F) to create contact and attach pad protrusions on the bottom of the structure. The photoresist 504 is then stripped and the structure is cleaned (FIG. 5G).

Figure 5H:
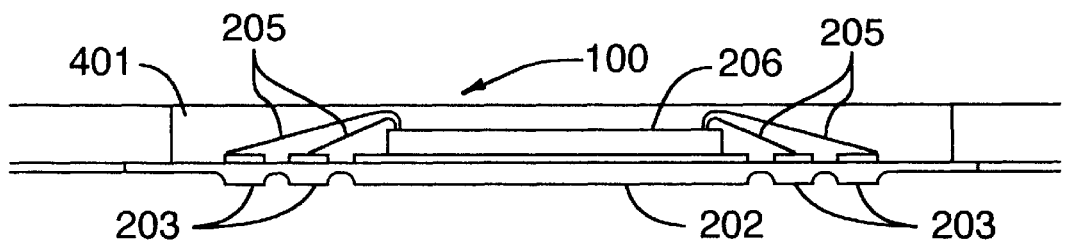
Figure 5I:
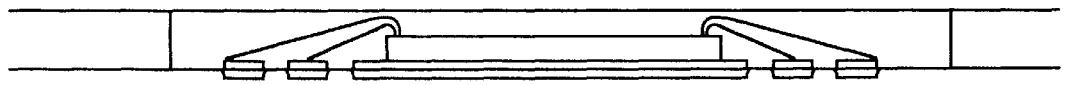
Figure 5J:
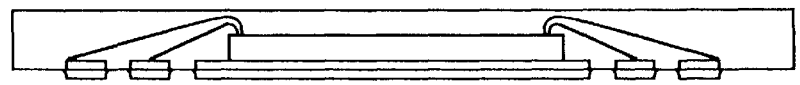

Next, the semiconductor 206 is attached to the pad 202, gold wire bonds 203 are attached to the multi-row leads 203 and the structure is encapsulated as discussed above in mold 401, such that the contact pad and attach pad protrusions remain exposed (FIG. 5H). A final etch back is performed (FIG.5I) and the individual units are singulated. It will be noted that the steps in Applicants' prior LPCC process of saw singulating between the inner and outer rows of leads, is eliminated. Also, as with the embodiments of FIGS. 1 to 4, post mold deflashing and cleaning has been eliminated.

Other embodiments of the invention are possible. For example, in addition to the multi-row embodiment shown in FIG. 5, the processes set forth with reference to FIGS. 1–4 may also be used to create multi-row structures rather than the single-row structures illustrated. No additional processing steps are required beyond those described above, although the preliminary partial etch pattern is required to create the multi-row pattern and additional wire bonding is required to connect the additional rows. This alternative and others are believed to be within the sphere and scope of the invention as set forth in the claims appended hereto.

We claim:

1. A process for fabricating a leadless plastic chip carrier, comprising the steps of:

partially etching at least a top surface of a leadframe strip to define a die attach pad and at least one row of contact pads adjacent to said die attach pad of said leadless plastic chip carrier;

mounting a semiconductor die to said die attach pad on said top surface and wire bonding said semiconductor die to said contact pads;

encapsulating said top surface of said leadframe strip in a molding material;

etching back a bottom surface of said leadframe strip such that only portions of the leadframe strip that are interposed between the portions of the leadframe strip that define the die attach pad and the at least one row of contact pads are removed so as to cause said contact pads to be isolated from said die attach pad; and singulating said leadless plastic chip carrier from said leadframe strip.

2. A process for fabricating a multi-row leadless plastic chip carrier, comprising the steps of:

partially etching said top surface of a leadframe strip to define a first level connect array of inner and outer rows of contact pads circumscribing a die attach pad on said top surface of said leadless plastic chip carrier;

partially etching said top surface and a bottom surface of said leadframe strip to define a second level connect array of inner and outer rows of contact pads circumscribing said die attach pad on said top and bottom surfaces of said leadless plastic chip carrier;

mounting a semiconductor die to said die attach pad on said top surface and wire bonding said semiconductor die to said inner and outer rows of contact pads;

encapsulating said top surface of said leadframe strip in a molding material;

etching back said bottom surface of said leadframe strip to isolate said second level connect array of said contact pads from said die attach pad; and singulating said leadless plastic chip carrier from said leadframe strip.

3. The process of claim 1, wherein both said top surface and said bottom surface of said leadframe strip are partially etched according to a mirror image pattern for defining said at least one row of contact pads adjacent said die attach pad.

4. The process of claim 1, wherein only said top surface of said leadframe strip is partially etched, and further including a step of attaching solder balls to said contact pads exposed as a result of said step of etching back said bottom surface of said leadframe strip.

5. The process of claim 1, wherein only said top surface of said leadframe strip is partially etched, and further including a step of applying and patterning photoresist to said bottom surface of said leadframe strip prior to said step of etching back said bottom surface such that said contact pads and said die attach pad are provided with a standoff structure.

6. The process of claim 1, further including a step of plating said leadframe strip with one of either nickel or palladium following said step of partially etching.

7. The process of claim 1, further including a step of electroless gold plating said contact pads and said die attach pad exposed as a result of said step of etching back said bottom surface of said leadframe strip.

8. The process of claim 1, further including a step of solder dipping said contact pads and said die attach pad exposed as a result of said step of etching back said bottom surface of said leadframe strip.

9. The process of claim 1, further including a step of chemically passivating said contact pads and said die attach pad exposed as a result of said step of etching back said bottom surface of said leadframe strip.

10. The process of claim 1, wherein said step of singulating said leadless plastic chip carrier from said leadframe strip incorporates one of either saw singulation or punch singulation.

11. A process for fabricating a multi-row leadless plastic chip carrier, comprising the steps of:

partially etching a top surface of a leadframe strip to define a first level connect array of inner and outer rows of contact pads circumscribing a die attach pad on said top surface of said leadless plastic chip carrier;

partially etching said top surface and a bottom surface of said leadframe strip to define a second level connect array of inner and outer rows of contact pads circumscribing said die attach pad on said top and bottom surfaces of said leadless plastic chip carrier;

mounting a semiconductor die to said die attach pad on said top surface and wire bonding said semiconductor die to said inner and outer rows of contact pads;

encapsulating said top surface of said leadframe strip in a molding material;

etching back said bottom surface of said leadframe strip such that only portions of the leadframe strip that are interposed between the portions of the leadframe strip that define the die attach pad and the first level connect array of inner and outer rows of contact pads are removed so as to cause said second level connect array of said contact pads to be isolated from said die attach pad, and singulating said leadless plastic chip carrier from said leadframe strip.

12. The process of claim 1, further including a step of barrel plating solder on said contact pads and said die attach pad exposed as a result of said step of etching back said bottom surface of said lead frame strip.

* * * * *